(12) United States Patent
Li et al.

(10) Patent No.: US 10,957,872 B2
(45) Date of Patent: Mar. 23, 2021

(54) ELECTRODE AND ORGANIC ELECTROLUMINESCENT DEVICE USING SAME

(71) Applicants: Kunshan New Flat Panel Display Technology Center Co., Ltd., Kunshan (CN); KunShan Go-Visionox Opto-Electronics Co., Ltd., Kunshan Development Zone (CN)

(72) Inventors: Weiwei Li, Kunshan (CN); Chao Min, Kunshan (CN); Zhizhong Luo, Kunshan (CN); Song Liu, Kunshan (CN); Wei Ao, Kunshan (CN)

(73) Assignees: Kunshan New Flat Panel Display Technology Center Co. Ltd., Jiangsu (CN); Kunshan Go-Visionox Opto-Electronics Co., Ltd., Jiangsu (CN)

( * ) Notice: Subject to any disclaimer, the term of this patent is extended or adjusted under 35 U.S.C. 154(b) by 72 days.

(21) Appl. No.: 16/307,070

(22) PCT Filed: Jan. 5, 2018

(86) PCT No.: PCT/CN2018/071554
§ 371 (c)(1),
(2) Date: Dec. 4, 2018

(87) PCT Pub. No.: WO2018/127128
PCT Pub. Date: Jul. 12, 2018

(65) Prior Publication Data
US 2019/0148666 A1    May 16, 2019

(30) Foreign Application Priority Data
Jan. 5, 2017   (CN) .......................... 201710007519.6

(51) Int. Cl.
*H01L 51/52*     (2006.01)
*H01L 51/00*     (2006.01)
*H01L 51/50*     (2006.01)

(52) U.S. Cl.
CPC ........ *H01L 51/5234* (2013.01); *H01L 51/006* (2013.01); *H01L 51/0072* (2013.01);
(Continued)

(58) Field of Classification Search
CPC ............. H01L 51/5221; H01L 51/5234; H01L 51/5228
See application file for complete search history.

(56) References Cited

U.S. PATENT DOCUMENTS

| | | |
|---|---|---|
| 6,255,774 B1 | 7/2001 | Pichler |
| 6,707,248 B1 | 3/2004 | Burroughes et al. |

(Continued)

FOREIGN PATENT DOCUMENTS

| | | |
|---|---|---|
| CN | 1825662 | 8/2006 |
| CN | 101339976 | 1/2009 |

(Continued)

OTHER PUBLICATIONS

Japanese Notice for Reasons of Refusal with English translation dated Dec. 10, 2019, for Japanese Patent Application No. 2018-564978.

(Continued)

*Primary Examiner* — Sue A Purvis
*Assistant Examiner* — Scott Stowe
(74) *Attorney, Agent, or Firm* — McCarter & English, LLP

(57) ABSTRACT

An electrode and an organic electroluminescent device using the same are provided. The electrode comprises a first conductive layer (1), a second conductive layer (2) and a third conductive layer (3) that are arranged in a stacked (Continued)

manner The second conductive layer (2) has a single-layer structure or multi-layer composite structure formed by at least one of alkali earth metal, alkali earth metal alloy and alkali earth metal compound, and the third layer (3) has a work function of less than 3 eV. The respective conductive layers of the electrode can compensate with respect to the defects in one another, thereby making the performance of the electrode more stable. In the meantime, because the work function of the third conductive layer (3) is less than 3 eV, the barrier of organics-metal interface can be effectively reduced for guiding the electron injection, thereby increasing the light-emitting efficiency of device. Also, because the electrode has relatively good transmittance, it can be used as a transparent electrode.

14 Claims, 2 Drawing Sheets

(52) U.S. Cl.
CPC .......... *H01L 51/0085* (2013.01); *H01L 51/52* (2013.01); *H01L 51/5221* (2013.01); *H01L 51/5012* (2013.01); *H01L 51/5056* (2013.01); *H01L 51/5088* (2013.01); *H01L 51/5096* (2013.01); *H01L 51/5231* (2013.01); *H01L 2251/301* (2013.01); *H01L 2251/558* (2013.01)

(56) References Cited

U.S. PATENT DOCUMENTS

| | | | |
|---|---|---|---|
| 6,765,350 | B1 | 7/2004 | Burroughes et al. |
| 6,992,438 | B2 | 1/2006 | Burroughes et al. |
| 7,071,612 | B2 | 7/2006 | Burroughes et al. |
| 7,270,894 | B2 | 9/2007 | Liu |
| 8,446,090 | B2 | 5/2013 | Yoon et al. |
| 2003/0152801 | A1 | 8/2003 | Liao et al. |
| 2004/0075382 | A1 | 4/2004 | Stegamat et al. |
| 2005/0001540 | A1 | 1/2005 | Burroughes et al. |
| 2005/0282068 | A1 | 12/2005 | Lie et al. |
| 2010/0270544 | A1 | 10/2010 | Yamauchi |
| 2010/0301741 | A1* | 12/2010 | Kim ............... H01L 51/5234 313/504 |
| 2016/0133880 | A1* | 5/2016 | Lee ............... H01L 51/5275 257/40 |

FOREIGN PATENT DOCUMENTS

| | | |
|---|---|---|
| CN | 104124368 | 10/2014 |
| CN | 104700922 | 6/2015 |
| EP | 1076368 | 2/2001 |
| EP | 1610397 A2 | 12/2005 |
| EP | 2234459 A1 | 9/2010 |
| JP | 2003-068471 A | 3/2003 |
| JP | 2003-234196 A | 8/2003 |
| JP | 2004-146379 A | 5/2004 |
| JP | 2009-176730 A | 8/2009 |
| KR | 10-2001-0109292 | 12/2001 |
| KR | 10-2006-0046494 | 5/2006 |
| KR | 10-2010-0106426 | 10/2010 |
| TW | 200948178 | 11/2009 |
| TW | 201535825 | 9/2015 |
| WO | WO 0048258 A1 | 8/2000 |

OTHER PUBLICATIONS

PCT International Search Report for PCT/CN2018/071554 dated Apr. 4, 2018.
English translation of Korean Decision of Rejection dated Oct. 9, 2019 for Korean Patent Application No. 10-2018-7032528.
Chinese Office Action for Chinese Application No. 2017100075196 dated Feb. 26, 2019, with English translation. 10 Pages.
English translation of Decision of Rejection dated Oct. 9, 2019 for Chinese Patent Application No. 201710007519.6.
Taiwanese Office Action dated Nov. 16, 2018 for Taiwanese Application No. 10721072900 (with English translation).
Extended European Search Report dated Jul. 7, 2019 for European Application No. 18736429.4.
Second Office Action dated Aug. 20, 2019 in Chinese application No. 2017100075196, with English translation.
Japanese Office Action with English translation dated Apr. 20, 2020 for Japanese Patent Application 2018-564978.
Korean Office Action dated Apr. 28, 2020 with English translation for Korean Patent Application 10-2018-7032520.
Chinese Decision of Grant with English translation dated May 14, 2020 for Chinese Patent Application 2017100075196.
Korean Final Office Action with English translation dated Oct. 30, 2020 for Korean Patent Application 10-2018-7032528.

\* cited by examiner

ELECTRODE AND ORGANIC ELECTROLUMINESCENT DEVICE USING SAME

CROSS-REFERENCE TO RELATED APPLICATIONS

This application is a 35 U.S.C. § 371 National Stage filing of International Application No. PCT/CN2018/071554, filed on Jan. 5, 2018, which claims priority to Chinese Patent Application No. 201710007519.6 filed Jan. 5, 2017.

TECHNICAL FIELD

The present disclosure relates to the field of organic electroluminescence, and particularly relates to an electrode and an organic electroluminescent device using the same.

BACKGROUND

An organic light-emitting diode (OLED) is an active light-emitting device. As compared to thin-film-transistor liquid crystal display (LCD) and plasma display panel (PDP) in the prior art of panel display technologies, an organic light-emitting display device using organic light-emitting diodes has advantages such as high contrast ratio, wide viewing angle, low power consumption and thinner volume, is expected to become the next-generation mainstream panel display technology, and is one of the panel display technologies that has received the most attention at present.

An OLED device mainly comprises an anode, an organic light-emitting layer and a cathode that are arranged in a stacked manner. In order to increase the electron injection efficiency, the OLED cathode is supposed to use a metal material having its work function that should be as low as possible, and because electrons are more difficult to be injected than holes, the level of work function of the metal seriously affects the light-emitting efficiency and service life of an OLED device. Lower work function of the metal may achieve easier electron injection, so as to achieve higher light-emitting efficiency. Besides, lower work function may achieve lower barrier of the organics-metal interface, so as to achieve less Joule heat produced during work, thus, the service life of device may be largely increased.

However, a single-layered metal cathode with a low work function, such as Mg, Ca, easily becomes oxidized in air, which causes the instability of device and shortens the service life of device, therefore, an alloy of metal with a low work function and anti-corrosion metal is usually selected to alleviate this problem. When cathode film made of a single metal is evaporation-plated, a lot of defects would be formed, which leads to deterioration of the oxidative resistance thereof. When an alloy cathode is evaporation-plated, a small amount of metal having relatively active chemical property would preferentially diffuse into the defects, which makes the film structure more complete, so as to make the entire cathode layer stable.

Therefore, it is one of the key technologies for promoting the development of OLED industrial technology to develop a cathode structure having superior performance.

SUMMARY OF THE DISCLOSURE

In view of the above, an electrode having superior performance and an organic electroluminescent device using the same are provided.

The technical schemes adopted by the present disclosure are as follows:

The electrode of the present disclosure comprises a first conductive layer, a second conductive layer and a third conductive layer that are arranged in a stacked manner. The second conductive layer has a single-layer structure or multi-layer composite structure formed by at least one of alkali earth metal, alkali earth metal alloy and alkali earth metal compound. The first conductive layer and the second conductive layer both have a transmittance of no less than 40%, and the third conductive layer has a work function of less than 3 eV.

Optionally, the third conductive layer has a single-layer structure or multi-layer composite structure formed by at least one of rare-earth metal, rare-earth metal alloy and rare-earth metal compound.

Optionally, the rare-earth metal is lanthanide metal.

Optionally, the lanthanide metal is Ytterbium and/or Samarium.

Optionally, the first conductive layer is a silver layer.

Optionally, the first conductive layer has a thickness of 5 nm-20 nm.

Optionally, the second conductive layer has a thickness of 0.5 nm-10 nm.

Optionally, the second conductive layer has a thickness of 0.5 nm-2 nm.

Optionally, the third conductive layer has a thickness of 0.5 nm-10 nm.

The organic electroluminescent device of the present disclosure comprises a first electrode, an organic light-emitting layer and a second electrode that are arranged in a stacked manner, wherein, the second electrode is the aforementioned electrode, and the third conductive layer is disposed adjacent to the organic light-emitting layer.

As compared to the prior art, the above-mentioned technical solutions of the present disclosure have the following advantages:

1. In the electrode provided by an embodiment of the present disclosure, it comprises a first conductive layer, a second conductive layer and a third conductive layer that are arranged in a stacked manner. The first conductive layer and the second conductive layer both have a transmittance of no less than 40%, and the third conductive layer has a work function of less than 3 eV. The respective conductive layers of the electrode can compensate with respect to the defects in one another, thereby making the performance of electrode more stable. In the meantime, because the work function of the third conductive layer is less than 3 eV, the barrier of organics-metal interface can be effectively reduced for guiding the electron injection, which may help to increase the light-emitting efficiency of device. Also, the first conductive layer and the second conductive layer both have a transmittance of no less than 40%, so that the electrode has relatively good transmittance and can be used as a transparent electrode.

2. In the electrode provided by an embodiment of the present disclosure, the third conductive layer has a single-layer structure or multi-layer composite structure formed by at least one of rare-earth metal, rare-earth metal alloy and rare-earth metal compound. Wherein, the rare-earth metal not only has a relatively low work function, which can effectively lower the electron injection energy barrier and thus lower the drive voltage of device, but also has relatively low light absorbance, which has relatively small impact on the light out-coupling efficiency of device.

3. In the electrode provided by an embodiment of the present disclosure, the second conductive layer can effectively prevent the material of the third conductive layer from dissolving in the material of the first conductive layer as a solid solution, which can ensure the stability of electrode and thus effectively improve the stability and service life of device applying it. In the meantime, the second conductive layer has a thickness of 0.5 nm-10 nm and has good light transmitting performance, which allow the electrode to have good transmittance and be able to be used as a transparent electrode.

BRIEF DESCRIPTION OF THE DRAWINGS

In order to make the content of the present disclosure easier to be understood clearly, hereinafter, the present disclosure is further described in detail according to specific embodiments of the present disclosure with reference to the accompanying drawings, wherein.

The reference signs in the accompanying drawings represent: 1-first conductive layer, 2-second conductive layer, 3-third conductive layer.

DETAILED DESCRIPTION OF EMBODIMENTS

In order to make the objectives, technical solutions and advantages of the present disclosure clearer, detailed description of embodiments of the present disclosure is further given below, with reference to the accompanying drawings.

The present disclosure can be implemented in many different forms and should not be interpreted to be limited to the embodiments described herein. On the contrary, by providing these embodiments, the present disclosure is made complete and thorough, and the concept of the present disclosure is sufficiently conveyed to those skilled in the art. The present disclosure will be only defined by the claims. In the accompanying drawings, for the sake of clarity, dimensions and relative sizes of layers and areas might be exaggerated.

Embodiment 1

Figure 1:
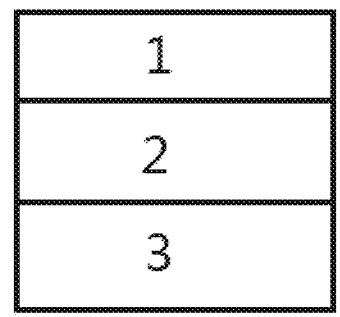
FIG. 1 is a structural schematic diagram of the electrode of Embodiment 1 of the present disclosure.

This embodiment provides an electrode, as shown in FIG. 1, the electrode comprises a first conductive layer 1 and a second conductive layer 2 that are arranged in a stacked manner. The first conductive layer 1 is Ag layer with a thickness of 16 nm, the second conductive layer 2 is Mg layer with a thickness of 1 nm, and a third conductive layer 3 is Yb layer with a thickness of 1 nm.

This embodiment also provides an organic electroluminescent device, Ag/ITO(20 nm)/HATCN(20 nm)/NPB(40 nm)/mCBP:3 wt % Ir(piq)$_3$(30 nm)/TPBi(50 nm)/Yb (1 nm)/Mg(1 nm)/Ag(16 nm)/ITO(20 nm).

Wherein, the stacked Ag and ITO layer is the first electrode.

The HATCN (2,3,6,7,10,11-hexacyanyl-1,4,5,8,9,12-hexaazatriphenylene) layer is a hole injection layer.

The NPB (N,N'-di-(1-naphthyl)-N,N'-diphenyl-1,1'-biphenyl-4,4'-diamine) layer is a hole transport layer.

The layer of CBP (N'-di-carbazolyl-biphenyl) doped with Ir(piq)$_3$ (Tri-(1-phenylisoquinolinato-C2,N]-Iridium(III)) is a light-emitting layer.

The TPBi (1,3,5-tri-(1-phenyl-1H-benzimidazole-2-yl)-benzene) layer is a hole blocking layer.

The above-mentioned electrode is a second electrode.

The ITO (Indium Tin Oxide) layer is an optical coupling layer.

As an alternative embodiment of the present disclosure, the structure of the organic electroluminescent device is not limited to this, as long as it applies the electrode of the present disclosure and can thereby realize the purpose of the present disclosure, thus belonging to the protection scope of the present disclosure.

Embodiment 2

This embodiment provides an electrode with a structure similar to that of Embodiment 1, but the difference is that the third conductive layer is Yb$_2$O$_3$ layer with a thickness of 1 nm.

This embodiment also provides an organic electroluminescent device with a structure similar to that of Embodiment 1, but the difference is that the second electrode is the electrode according to this embodiment:

Ag/ITO (20 nm)/HATCN(20 nm)/NPB (40 nm)/mCBP:3 wt % Ir(piq)$_3$(30 nm)/TPBi(50 nm)/Yb$_2$O$_3$(1 nm)/Mg(1 nm)/Ag(16 nm)/ITO (20 nm).

Embodiment 3

This embodiment provides an electrode with a structure similar to that of Embodiment 1, but the difference is that the second conductive layer is an alloy layer of Mg and Ag with a thickness of 2 nm, and the first conductive layer has a thickness of 5 nm.

This embodiment also provides an organic electroluminescent device with a structure similar to that of Embodiment 1, but the difference is that the second electrode is the electrode according to this embodiment.

Embodiment 4

This embodiment provides an electrode with a structure similar to that of Embodiment 1, but the difference is that the third conductive layer is an alloy layer of Sm and Ca with a thickness of 0.5 nm, wherein the mass content of Sm is 50%.

This embodiment also provides an organic electroluminescent device with a structure similar to that of Embodiment 1, but the difference is that the second electrode is the electrode according to this embodiment.

Embodiment 5

This embodiment provides an electrode with a structure similar to that of Embodiment 1, but the difference is that the third conductive layer is YbN layer, and the second conductive layer is MgCO$_3$ layer with a thickness of 1 nm.

This embodiment also provides an organic electroluminescent device with a structure similar to that of Embodiment 1, but the difference is that the second electrode is the electrode according to this embodiment.

Embodiment 6

This embodiment provides an electrode with a structure similar to that of Embodiment 1, but the difference is that the first conductive layer has a thickness of 20 nm, and the second conductive layer has a thickness of 0.5 nm.

This embodiment also provides an organic electroluminescent device with a structure similar to that of Embodiment 1, but the difference is that the second electrode is the electrode according to this embodiment.

Embodiment 7

This embodiment provides an electrode with a structure similar to that of Embodiment 1, but the difference is that the second conductive layer has a thickness of 10 nm, and the third conductive layer has a thickness of 10 nm.

This embodiment also provides an organic electroluminescent device with a structure similar to that of Embodiment 1, but the difference is that the second electrode is the electrode according to this embodiment.

Comparison Example 1

This comparison example provides an electrode with a structure similar to that of Embodiment 1, but the difference is that there is no second conductive layer contained therein.

This comparison example also provides an organic electroluminescent device with a structure similar to that of Embodiment 1, but the difference is that the second electrode is the electrode according to this comparison example.

Comparison Example 2

This comparison example provides an electrode with a structure similar to that of Embodiment 1, but the difference is that there is no third conductive layer contained therein, and the second conductive layer is an alloy layer of Mg and Ag with a thickness of 2 nm.

This comparison example also provides an organic electroluminescent device with a structure similar to that of Embodiment 1, but the difference is that the second electrode is the electrode according to this comparison example.

Comparison Example 3

This comparison example provides an electrode with a structure similar to that of Embodiment 1, but the difference is that the third conductive layer is Ag layer.

This comparison example also provides an organic electroluminescent device with a structure similar to that of Embodiment 1, but the difference is that the second electrode is the electrode according to this comparison example.

Comparison Example 4

This comparison example provides an electrode with a structure similar to that of Embodiment 1, but the difference is that the second conductive layer has a thickness of 20 nm.

This comparison example also provides an organic electroluminescent device with a structure similar to that of Embodiment 1, but the difference is that the second electrode is the electrode according to this comparison example.

Test Example 1

Figure 2:
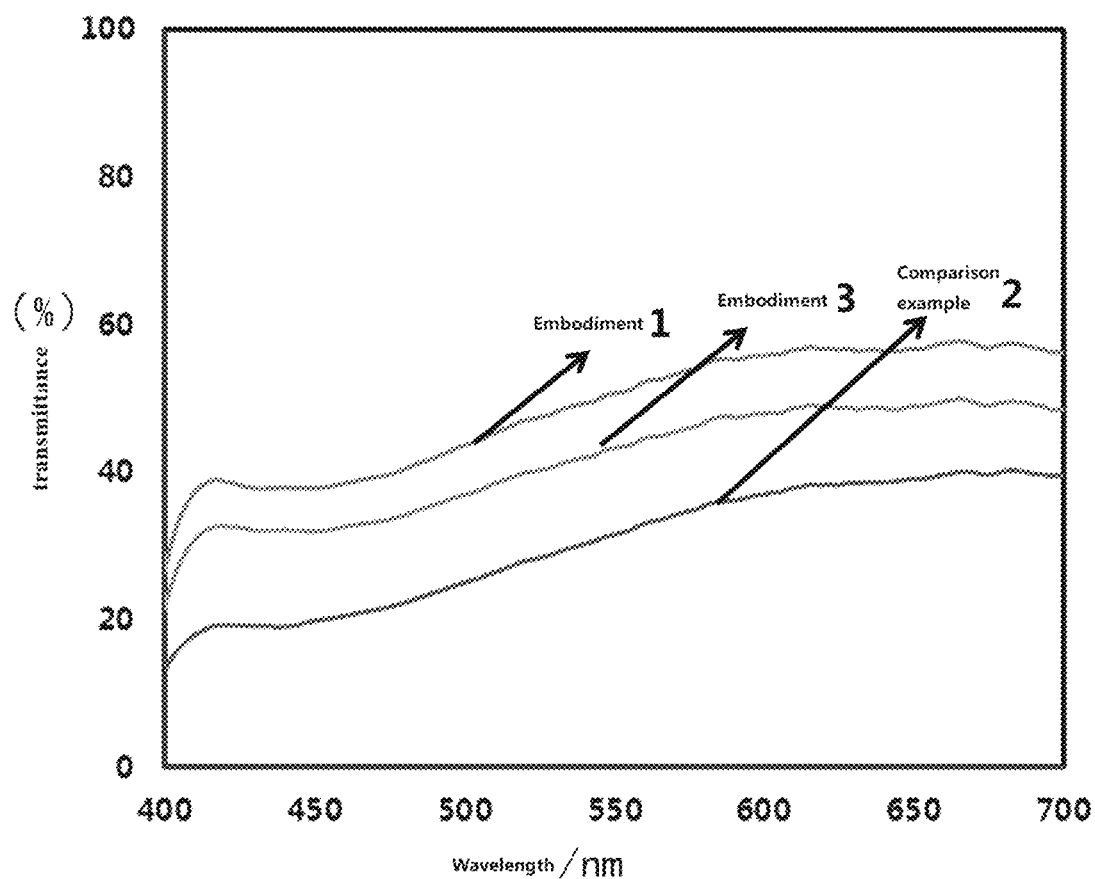
FIG. 2 is a transmittance comparison diagram of Embodiment 1, Embodiment 3 of the present disclosure as compared to Comparison example 2.
Figure 3:
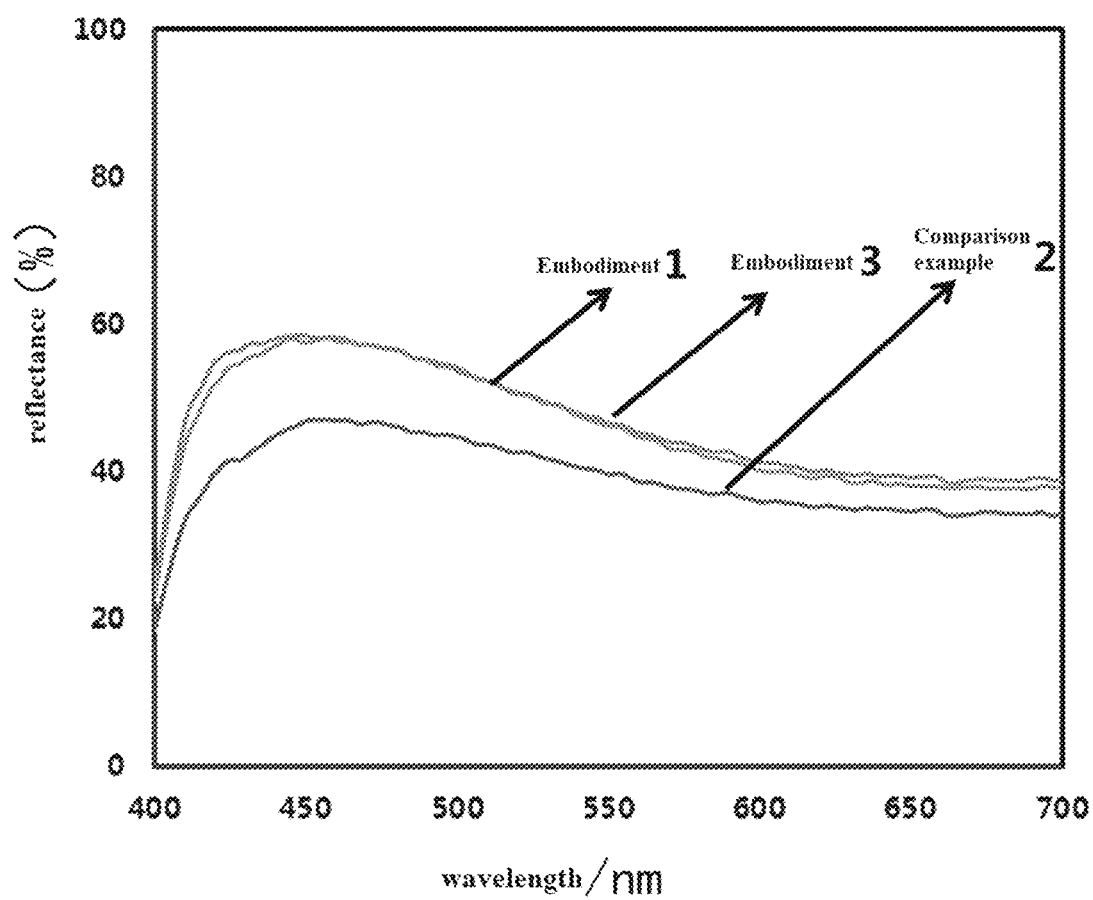
FIG. 3 is a reflectance comparison diagram of Embodiment 1, Embodiment 3 of the present disclosure as compared to Comparison example 2.

Transmittance test and reflectance test are performed on the electrodes provided by the above-mentioned Embodiments and Comparison examples. As shown in FIG. 2, in the range of visible light, the electrodes provided by Embodiment 1 and Embodiment 3 have a transmittance of 30% or more, and even up to 60%, whereas the electrode provided by Comparison example 2 has a transmittance of less than 30%. As shown in FIG. 2 and FIG. 3, by comparing the transmittance values and reflectance values of different cathode structures in Embodiment 1, Embodiment 3 and Comparison example 2, the transmittance values of light in Embodiment 1 and Embodiment 3 exceed 40%, which are 25% higher than that in Comparison example 2, therefore the light out-coupling characteristic of the OLED device can be effectively increased. The reflectance values of light in Embodiment 1 and Embodiment 3 are 42% higher than that of Comparison example 2. The increase of the transmittance values and the reflectance values can effectively improve the light out-coupling efficiency and thus improve the light-emitting efficiency of device.

Test Example 2

When an organic electroluminescent device has worked for a long time, an organic film thereof may change from an initial amorphous film into a crystalline film, such a change of film would cause the decaying of device.

Therefore, the devices are annealed respectively at different temperatures for 1 hour, and the test results of $T_{97}$ (service life for the brightness to decay from 10000 nit to 97%) of the annealed devices as compared to unannealed devices (25° C.) are listed in Table 1.

TABLE 1

Test results of $T_{97}$ of different devices

| | annealing temperature (° C.) | | | | |
| --- | --- | --- | --- | --- | --- |
| | 25 $T_{97}(h)$ | 80 $T_{97}(h)$ | 100 $T_{97}(h)$ | 120 $T_{97}(h)$ | 140 $T_{97}(h)$ |
| Embodiment 1 | 765 | 749 | 721 | 690 | 573 |
| Embodiment 2 | 733 | 705 | 645 | 620 | 527 |
| Embodiment 3 | 755 | 726 | 694 | 618 | 564 |
| Embodiment 4 | 621 | 605 | 573 | 526 | 473 |
| Embodiment 5 | 681 | 629 | 566 | 504 | 441 |
| Embodiment 6 | 756 | 732 | 713 | 677 | 545 |
| Embodiment 7 | 741 | 725 | 705 | 681 | 531 |
| Comparison example 1 | 421 | 378 | 301 | 193 | 56 |
| Comparison example 2 | 350 | 295 | 150 | 97 | 33 |
| Comparison example 3 | 211 | 156 | 123 | 91 | 29 |
| Comparison example 4 | 599 | 456 | 323 | 191 | 79 |

The data in Table 1 indicates that, when the electrode of the present disclosure is used in an organic electroluminescent device, the service life of device is far longer than that in the Comparison examples, with even better stability of device in high temperature condition.

Test Example 3

Dynamic service-life experiments (50% alternating checkerboard evaluation) are carried out, that is, in a certain work environment, the display screen is lit up in a pattern of alternating checkerboard which changes once every 10 seconds. The service life of device is evaluated by measuring the brightness decay, and the experiment is stopped when the brightness decays to 50% of the initial brightness. The brightness is measured by using a Spectrascan PR655 photometer, and the dynamic service-life experiments can be classified into normal temperature experiments (25° C.) and high temperature experiments (85° C.).

TABLE 2

Result of dynamic service-life experiments of different devices at normal temperature (25° C.)

| Groups | Brightness (cd/m$^2$) | Drive voltage (V) | Efficiency (cd/A) | $T_{97}$ (h) | CIE (x, y) |
|---|---|---|---|---|---|
| Embodiment 1 | 5000 | 4.94 | 55.09 | 765 | (0.66, 0.33) |
| Embodiment 2 | 5000 | 4.95 | 54.94 | 733 | (0.66, 0.33) |
| Embodiment 3 | 5000 | 4.99 | 56.77 | 755 | (0.66, 0.33) |
| Embodiment 4 | 5000 | 5.02 | 54.68 | 621 | (0.66, 0.34) |
| Embodiment 5 | 5000 | 5.10 | 55.66 | 681 | (0.67, 0.33) |
| Embodiment 6 | 5000 | 4.95 | 55.06 | 756 | (0.67, 0.33) |
| Embodiment 7 | 5000 | 4.96 | 55.13 | 741 | (0.67, 0.33) |
| Comparison example 1 | 5000 | 5.26 | 47.13 | 421 | (0.66, 0.33) |
| Comparison example 2 | 5000 | 5.22 | 49.42 | 350 | (0.65, 0.33) |
| Comparison example 3 | 5000 | 5.46 | 50.36 | 211 | (0.66, 0.32) |
| Comparison example 4 | 5000 | 5.12 | 50.86 | 599 | (0.67, 0.34) |

It can be known from the data in Table 2 that, when the electrode of the present disclosure is used in an organic electroluminescent device, it can significantly increase the light-emitting efficiency and service life of device as well as lower the driving voltage. In the meantime, it can be seen from the data of color coordinates (CIE) that, as the electrode has relatively low light absorbance, it has no influence on the light-emitting color of device.

Apparently, the aforementioned embodiments are merely examples illustrated for clearly describing the present disclosure, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present disclosure.

The invention claimed is:

1. An electrode, comprising a first conductive layer, a second conductive layer and a third conductive layer that are arranged in sequence in a stacked manner, the second conductive layer has a single-layer structure or multi-layer composite structure formed by at least one of alkali earth metal, alkali earth metal alloy and alkali earth metal compound, and the third conductive layer has a work function of less than 3 eV and has a single-layer structure or multi-layer composite structure formed by a rare-earth metal compound, wherein the third conductive layer is a Yb$_2$O$_3$ layer or a YbN layer.

2. The electrode according to claim 1, wherein the second conductive layer is a Mg layer, or a MgCO$_3$ layer, or an alloy layer of Mg and Ag.

3. The electrode according to claim 1, wherein the first conductive layer is a silver layer.

4. The electrode according to claim 1, wherein the first conductive layer has a thickness of 5 nm-20 nm.

5. The electrode according to claim 4, wherein the second conductive layer has a thickness of 0.5 nm-10 nm.

6. The electrode according to claim 5, wherein the second conductive layer has a thickness of 0.5 nm-2 nm.

7. The electrode according to claim 6, wherein the third conductive layer has a thickness of 0.5 nm-10 nm.

8. An organic electroluminescent device, comprising a first electrode, an organic light-emitting layer and a second electrode that are arranged in sequence in a stacked manner, the second electrode is an electrode that comprises a first conductive layer, a second conductive layer and a third conductive layer that are arranged in a stacked manner, the second conductive layer has a single-layer structure or multi-layer composite structure formed by at least one of alkali earth metal, alkali earth metal alloy and alkali earth metal compound, the third conductive layer has a work function less than 3 eV and has a single-layer structure or multi-layer composite structure formed by a rare-earth metal compound, wherein the third conductive layer is a Yb$_2$O$_3$ layer or a YbN layer, and the third conductive layer is disposed next to the organic light-emitting layer.

9. The organic electroluminescent device according to claim 8, wherein the second conductive layer is a Mg layer, or a MgCO$_3$ layer, or an alloy layer of Mg and Ag.

10. The organic electroluminescent device to claim 8, wherein the first conductive layer is a silver layer.

11. The organic electroluminescent device according to claim 8, wherein the first conductive layer has a thickness of 5 nm-20 nm.

12. The organic electroluminescent device according to claim 11, wherein the second conductive layer has a thickness of 0.5 nm-10 nm.

13. The organic electroluminescent device according to claim 12, wherein the second conductive layer has a thickness of 0.5 nm-2 nm.

14. The organic electroluminescent device according to claim 12, wherein the third conductive layer has a thickness of 0.5 nm-10 nm.

* * * * *